United States Patent
Ogino et al.

(10) Patent No.: US 7,977,018 B2
(45) Date of Patent: Jul. 12, 2011

(54) EXPOSURE DATA PREPARATION METHOD AND EXPOSURE METHOD

(75) Inventors: Kozo Ogino, Kawasaki (JP); Yasuhide Machida, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 199 days.

(21) Appl. No.: 12/332,456

(22) Filed: Dec. 11, 2008

(65) Prior Publication Data

US 2009/0176168 A1 Jul. 9, 2009

(30) Foreign Application Priority Data

Jan. 8, 2008 (JP) ................................. 2008-000950

(51) Int. Cl.
*G03F 9/00* (2006.01)
*G03C 5/00* (2006.01)
(52) U.S. Cl. ........................... 430/30; 430/296; 430/942
(58) Field of Classification Search .................... 430/30, 430/296, 942
See application file for complete search history.

(56) References Cited

U.S. PATENT DOCUMENTS 6,509,127 B1 * 1/2003 Yamashita ...................... 430/30

FOREIGN PATENT DOCUMENTS

| JP | 11-26360 | 1/1999 |
| JP | 2001-52999 | 2/2001 |
| JP | 2005-101501 | 4/2005 |

* cited by examiner

*Primary Examiner* — Christopher G Young
(74) *Attorney, Agent, or Firm* — Staas & Halsey LLP

(57) ABSTRACT

In the exposure data preparation method for charged particle beam exposure in which an exposure object is exposed while dose is adjusted for each pattern, the method including the steps of: classifying a pattern in terms of a target linewidth; setting a standard characteristic showing the relationship between a standard dose and a resultant linewidth of a resist pattern for a group of patterns having the target linewidth; and preparing exposure data by correcting a shape and dose so that a characteristic showing the relationship between dose of each pattern having the target linewidth and a resultant linewidth of a resist pattern follows the standard characteristic.

20 Claims, 9 Drawing Sheets

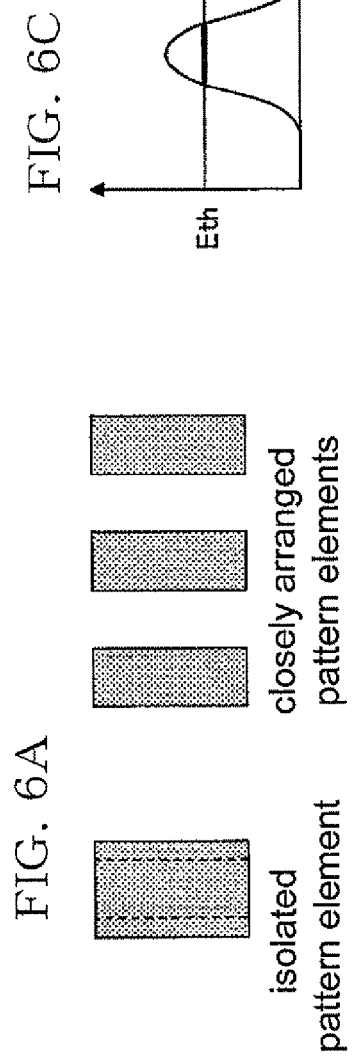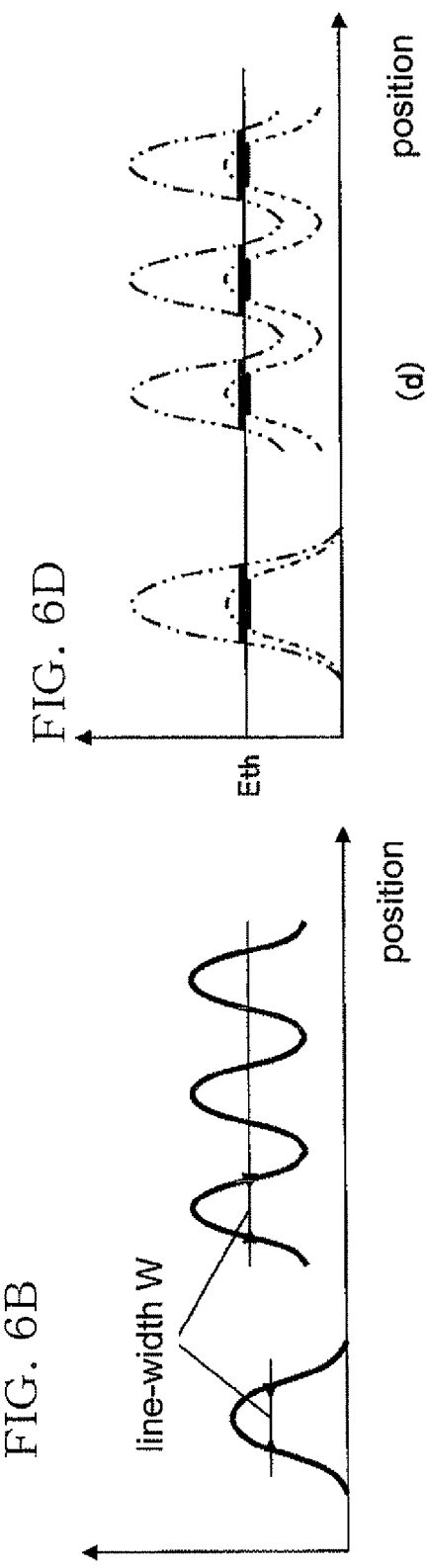
FIG. 6A
FIG. 6B
FIG. 6C
FIG. 6D

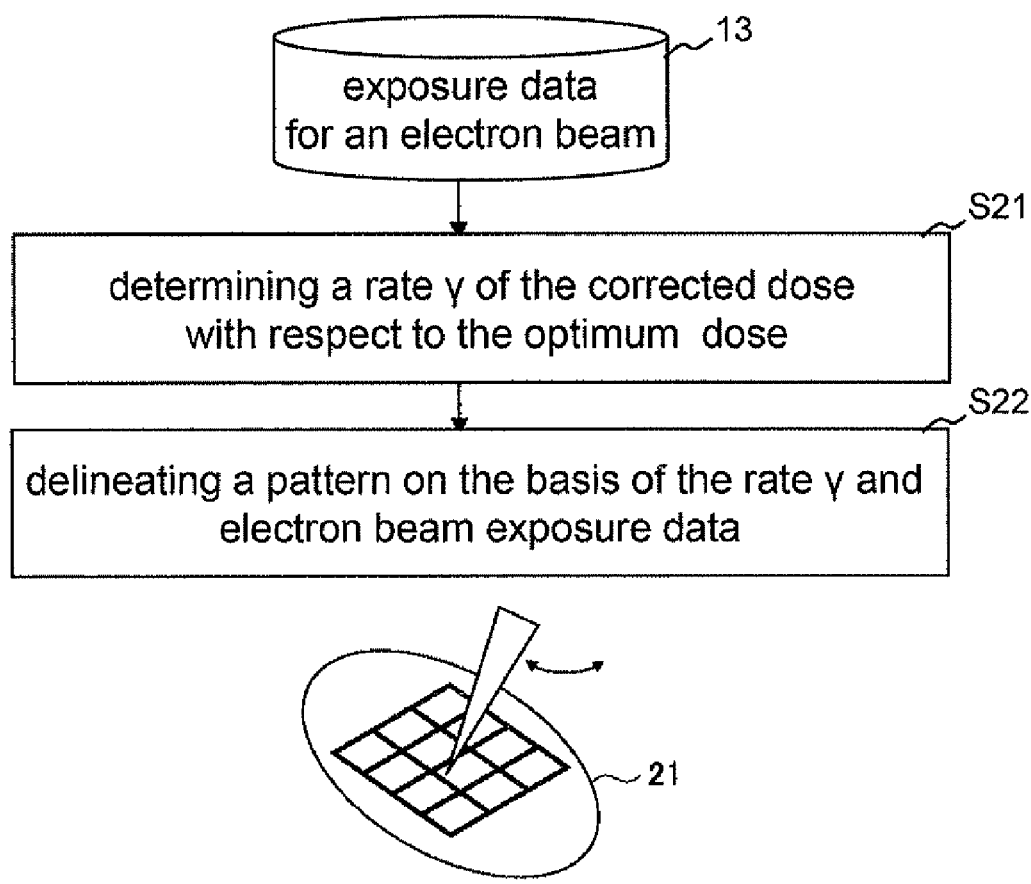

EXPOSURE DATA PREPARATION METHOD AND EXPOSURE METHOD

CROSS REFERENCE TO RELATED APPLICATION

This application is based upon and claims the benefit of priority from the prior Japanese Patent Application NO. 2008-950 filed on Jan. 8, 2008, the entire contents of which are incorporated herein by reference.

BACKGROUND OF THE INVENTION

1. Field of the Invention

The present invention relates to an exposure data preparation method and an exposure method. In particular, it relates to an exposure data preparation method for preparing exposure data to be used in a charged particle beam exposure technology using an electron beam or an ion beam in a lithography procedure and an exposure method using the exposure data.

2. Description of the Related Art

In electron beam exposure for delineating a pattern by irradiating an electron beam on a resist applied on a substrate, not only forward scattering where some incident electrons scatter in the resist but also backscattering where some electrons passing through the resist are reflected from the substrate and re-enter the resist occurs. Accordingly, even when an incident electron beam is directed onto one point on the resist, scattering of the beam produces proximity effects and energy deposited on the resist is widely distributed, which varies the size of the resultant resist pattern depending on the density of the pattern. The Exposure Intensity Distribution (EID), when the incident electron beam is directed onto one point (x, y) on the resist applied on the substrate constituted by one material, is generally approximated by a function shown as Formula (1) below, in which a forward scattering element and a backscattering element are expressed as a Gaussian distribution.

$$f(x, y) = \frac{1}{\pi(1+\eta)}\left\{\frac{1}{\beta_f^2}\exp\left(-\frac{x^2+y^2}{\beta_f^2}\right) + \frac{\eta}{\beta_b^2}\exp\left(-\frac{x^2+y^2}{\beta_b^2}\right)\right\} \quad (1)$$

Wherein, $\beta_f$ is a forward scattering length, $\beta_b$ is a backscattering length and $\eta$ is a backscattering intensity ratio. The values of the forward scattering length $\beta_f$, the backscattering length $\beta_b$ and the backscattering intensity ratio $\eta$ depend on electron beam energy, membrane thickness of the resist, the substrate material and so on, and are determined by experiment or simulation. For example, if the membrane thickness of the resist is 0.3 μm and the accelerating voltage of the electron beam is 50 kV, $\beta_f$=28 nm, $\beta_b$=11.43 μm and $\eta$=0.67. Generally, the forward scattering length $\beta_f$ is a value not limited to pure forward scattering, but includes components such as blurring of the electron beam due to aberration etc. (so-called beam blur) and acid diffusion.

In an existing proximity effect correction method, a pattern shape correction to reduce the linewidth for improvement of exposure margin and dose correction to correct the dose of the pattern in order to obtain a target linewidth at a threshold value $E_{th}$ of the deposited energy are executed. This kind of proximity effect correction method has been proposed, for example, in Japanese Laid-Open Patent Publication No. 2001-52999 or Japanese Laid-Open Patent Publication No. 11-26360.

SUMMARY

According to an aspect of the embodiments discussed herein, a method for preparing exposure data for charged particle beam exposure in which an exposure object is exposed while dose is adjusted for a pattern, the method including: classifying the pattern in terms of a target linewidth; setting a standard characteristic showing the relationship between a standard dose and a resultant linewidth of a resist pattern for a group of patterns having the target linewidth; and preparing exposure data by correcting a shape and dose so that a characteristic showing the relationship between the dose of each pattern having the target linewidth and a resultant linewidth of a resist pattern follows the standard characteristic.

The object and advents of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF THE DRAWINGS

FIGS. 6A, 6B, 6C and 6D are explanatory drawings of deposited energy distribution according to an embodiment of the present invention;

FIG. 9 is a flowchart for explaining the exposure steps.

DESCRIPTION OF THE PREFERRED EMBODIMENTS

Figure 1A:
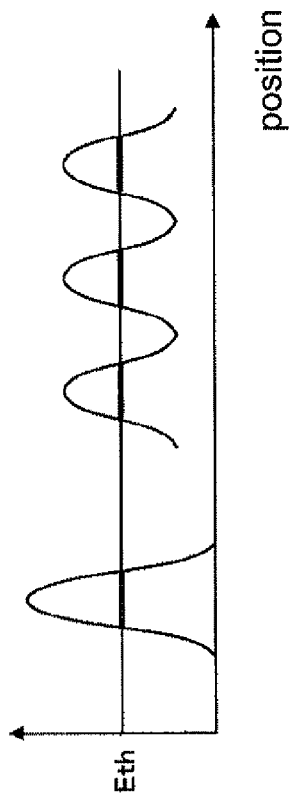
FIGS. 1A, 1B, 1C and 1D are explanatory drawings of the existing proximity effect correction method.
Figure 1C:
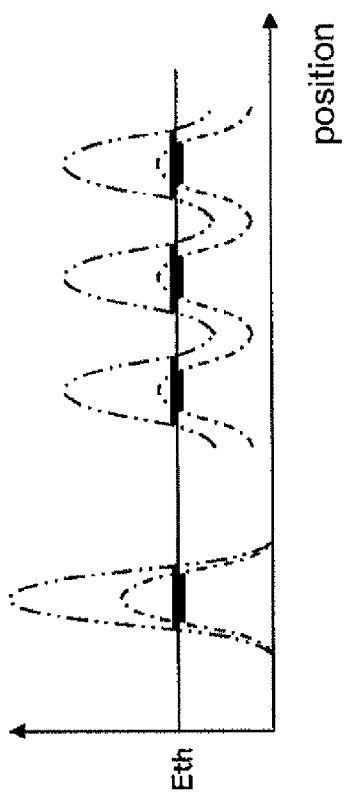
Figure 1B:
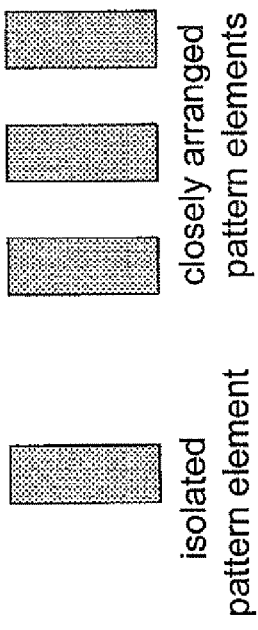
Figure 1D:
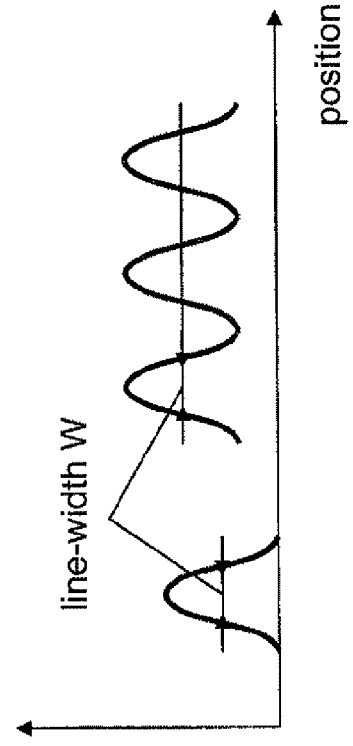

FIGS. 1A to 1D are drawings explaining the proximity effect correction method. Among the figures, FIG. 1A shows an exposure pattern including an isolated pattern element and closely arranged pattern elements, FIG. 1B shows deposited energy distribution per unit of dose, FIG. 1C shows deposited energy distribution after dose correction, and FIG. 1D shows deposited energy distributions before and after dose correction. In FIG. 1B, W indicates the target linewidth. Moreover, in FIGS. 1B, 1C and 1D, the transverse axes indicate a position of a pattern per arbitrary unit. Moreover, in FIG. 1D, the dashed lines and phantom lines respectively indicate deposited energy distributions before and after dose correction.

In addition, in a lithography procedure used in fabricating a semiconductor device, configurations such as a metal wiring and a via hole are already formed under the resist, and a substrate is constituted by a plurality of materials. Since the parameter of the backscattering element in the above Formula (1) varies depending on materials constituting the substrate, this simple formula makes it impossible to approximate the deposited energy distribution of the resist.

As a solution to the above problems, a method for obtaining a backscattering element of the deposited energy distribution considering a complicated multi-layer wiring structure has been proposed in Japanese Laid-Open Patent Publication No. 2005-101501 for example. By using a backscattering element calculated by this proposed method and a forward scattering element calculated by the first term of the Formula (1), a proximity effect due to a multi-layer wiring structure, that is, an interlayer proximity effect can be corrected even by using the existing proximity effect correction method.

Recently, in accordance with an improvement in the degree of integration of semiconductor devices, a finer pattern size has been required, and there has been a problem of fluctuation of a resultant linewidth of a resist pattern due to process fluctuation such as dose fluctuation and defocusing in a lithography process. Further, since an interlayer proximity effect cannot be ignored in electron beam exposure, linewidth fluctuation of a metal pattern constituting the multi-layer wiring, membrane thickness fluctuation of Chemical Mechanical Polishing (CMP) and so on become causes of the fluctuation of a resultant linewidth of a resist pattern. In this way, the causes of the fluctuation of a resultant linewidth of a resist pattern include not only known process fluctuation, but also unknown process fluctuation, for example, process fluctuation which has yet to be modeled or whose model is too complex to be evaluated.

Figure 2:
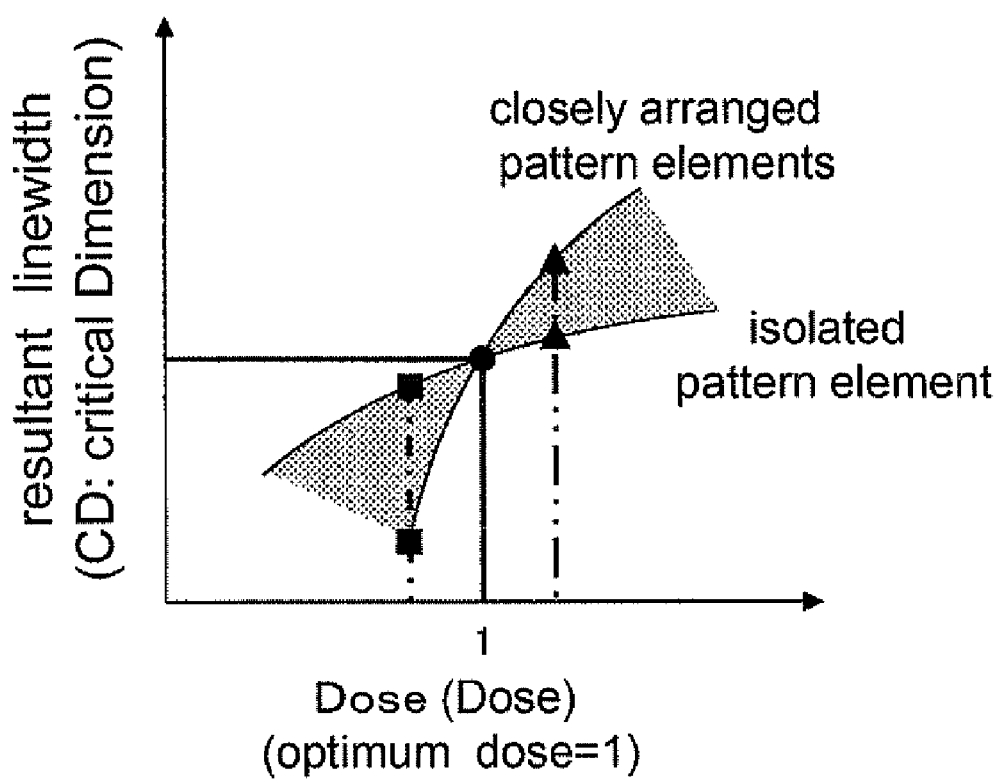
FIG. 2 is a drawing showing a CD-DOSE curve according to the existing proximity effect correction method.
Figure 3:
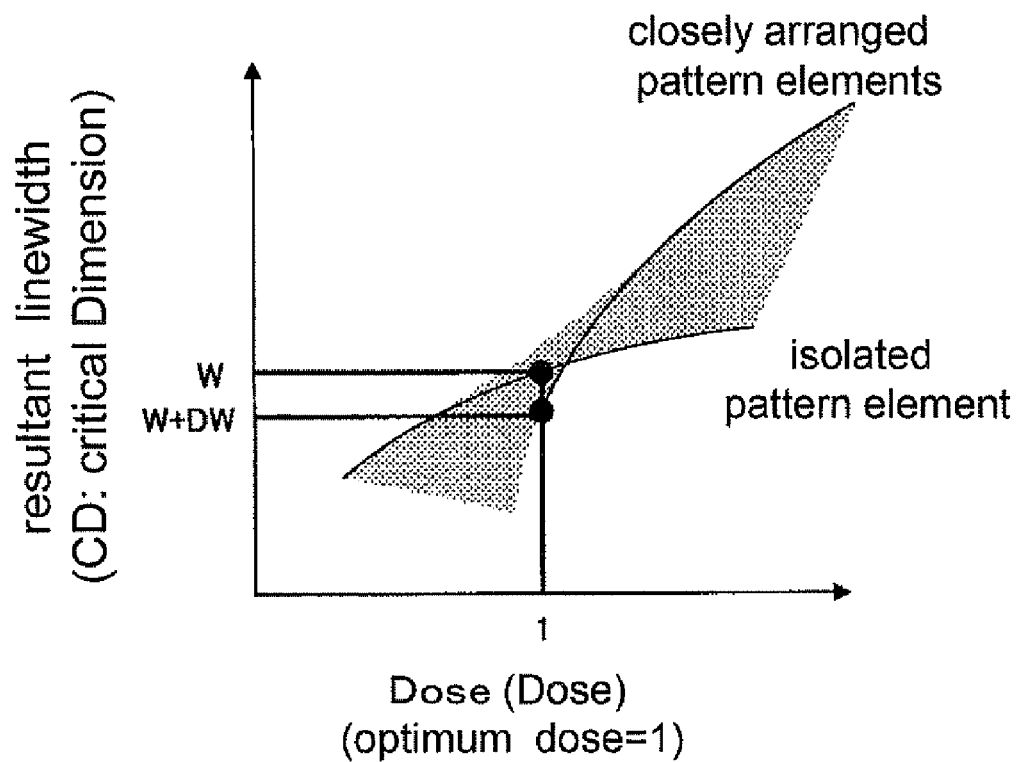
FIG. 3 is a drawing showing the change of the CD-DOSE curve with respect to the process fluctuation according to the existing proximity effect correction method.

Next, an effect of the process fluctuation with regard to the existing proximity effect correction method will be explained. When dose of a pattern including elements is uniformly multiplied by a constant, the resultant linewidth of each element from an isolated pattern element to closely arranged elements fluctuates as shown in FIG. 1D. The relationship between the dose and the resultant linewidth (CD-DOSE curve) of each element from an isolated pattern element to closely arranged pattern elements will be shown in FIG. 2. FIG. 2 is a CD-DOSE curve in the existing proximity effect correction method in which dose is standardized by the corrected dose for each element. In FIG. 2 and FIG. 3 described later, the vertical axes show the resultant linewidth (CD: Critical Dimension), and the transverse axes show the dose (DOSE). Moreover, a circular point indicates the resultant linewidth with corrected dose, and rectangular points and triangular points respectively indicate the resultant linewidths before and after dose correction. In the existing proximity effect correction method, the rate of change in the resultant linewidth in accordance with the change in dose, that is, the gradient of the CD-DOSE curve adjacent to a point where the dose is 1 varies for each element. This allows the rate of change of the CD-DOSE curve to vary with respect to process fluctuation, so that the fluctuation of linewidth between the elements becomes large as shown in FIG. 3. FIG. 3 shows the change of the CD-DOSE curve with respect to process fluctuation in the existing proximity effect correction method. This figure shows that limiting the deviation from the target linewidth within an acceptable range is difficult.

According to the present invention, paying attention to the fact that an exposure apparatus easily multiplies dose uniformly by a constant, fluctuation of a resultant linewidth between the patterns is reduced per dose before and after dose correction with respect to known process fluctuation in a group of patterns having the same target linewidth. In other words, exposure data is prepared so that the characteristic showing the relationship between the dose and the resultant linewidth of the resist pattern, that is, CD-DOSE curves are aligned with each other, and exposure is executed by adjusting the dose to reduce linewidth deviation with respect to unknown process fluctuation. The reason the patterns are classified in terms of the target linewidth is because there are differences of the acceptable amount of linewidth fluctuation and differences of the required dimensional accuracy and the like. By allowing the CD-DOSE curves to be aligned with each other, the CD-DOSE curves change in a similar manner with respect to process fluctuation, which reduces linewidth fluctuation between the patterns in a wide range of dose. Moreover, a uniform adjustment of the dose reduces the deviation from the target linewidth.

As described above, linewidth fluctuation between the patterns can be reduced with respect to various kinds of process fluctuation including unknown fluctuation.

Hereinafter, an embodiment of an exposure data preparation method and an exposure method according to the present invention will be explained with reference to FIGS. 4 to 9.

Figure 4:
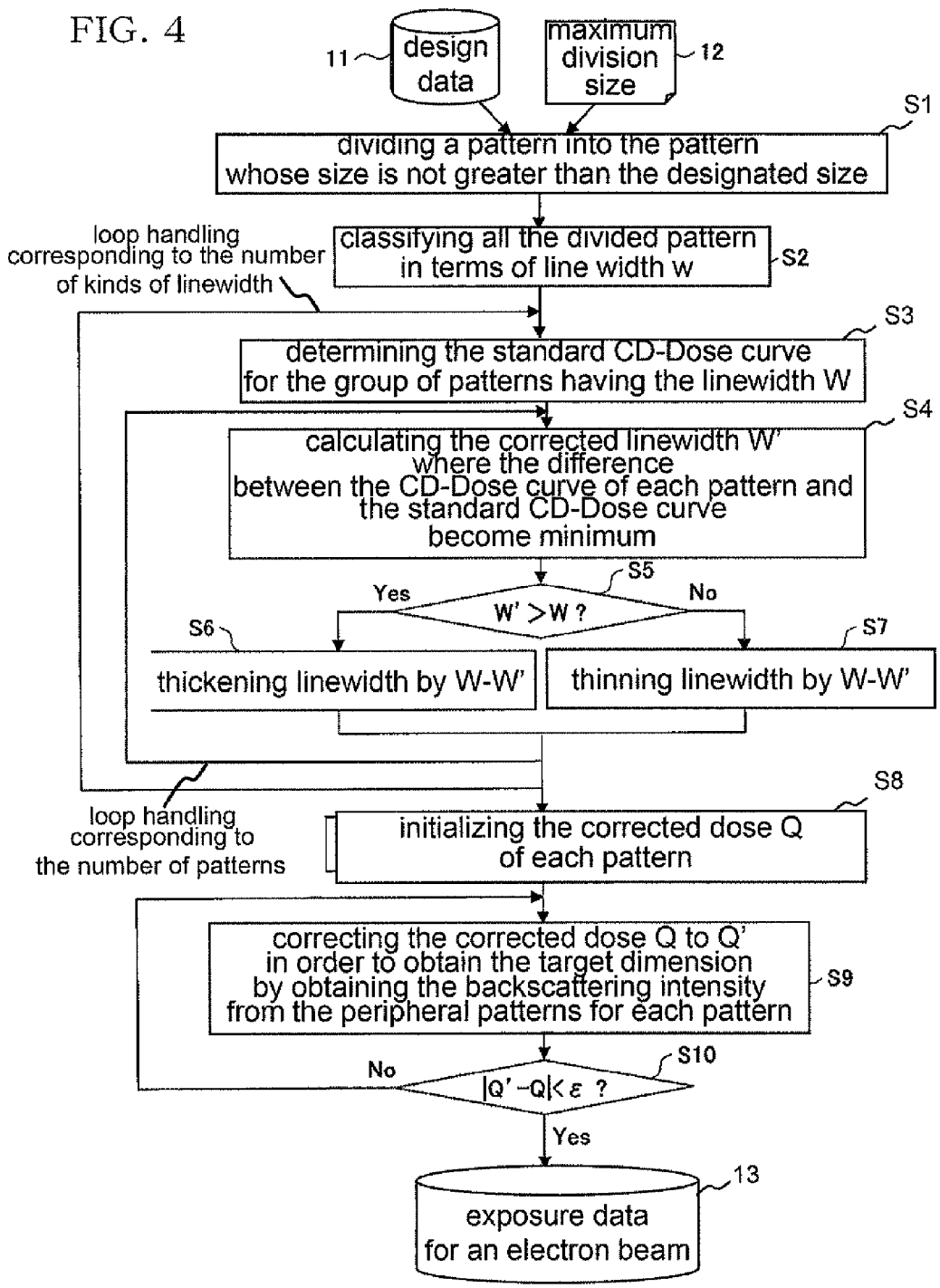
FIG. 4 is a flowchart for explaining the exposure data preparation steps.

The exposure data preparation method and the exposure method in the embodiment according to the present invention are useful in the fabrication of semiconductor devices. FIG. 4 is a flowchart for explaining the exposure data preparation steps for preparing exposure data in order to reduce fluctuation of a resultant linewidth between the patterns before and after dose correction with respect to known process fluctuation. The exposure steps to delineate a pattern of exposure data by adjusting the dose to reduce the linewidth deviation with respect to unknown process fluctuation will be explained later with reference to a flowchart of FIG. 9.

[Exposure Data Preparation Steps]

Processing of steps S1 to S10 shown in FIG. 4 will be executed by a general-purpose computer having a processor such as a CPU, a memory, and an input portion such as a keyboard. The program that allows the computer to execute each procedure of exposure data preparation steps is stored in the memory to be executed by the processor. This program may be stored in the memory of the computer from a computer-readable storage medium.

Referring to FIG. 4, in a step S1, design data 11 is entered and a pattern is divided into rectangular shapes so that the size of the pattern becomes not greater than a maximum division size 12 designated in advance. The design data 11 and the maximum division size 12 may be entered from the input portion of the computer, or may be read out from an inner or external memory of the computer and entered.

Figure 5:
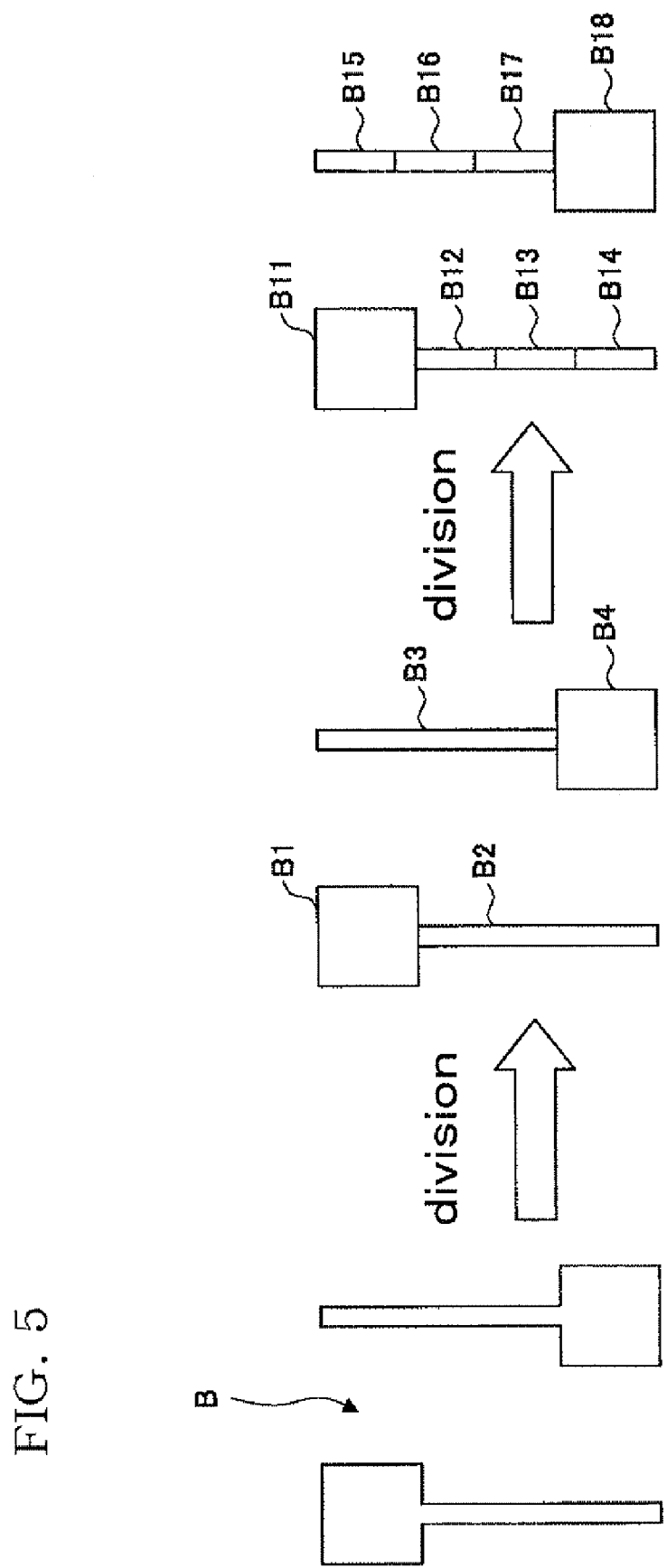
FIG. 5 is an explanatory drawing of the division of a pattern into rectangular areas.

FIG. 5 is an explanatory view of the division of the pattern into rectangular shapes. In FIG. 5, a pattern B expressed as the design data 11 is divided into rectangular areas B1 to B4, and further, the resultant pattern is evenly divided into rectangular areas B11 to B18 whose size is not greater than the maximum division size 12 (hereinafter, they are referred to as divided patterns). The maximum division size 12 is large enough to consider a backscattering element of deposited energy on the resist as substantially constant on each of the divided patterns B11 to B18, and it is one-tenth of the backscattering length $\beta_b$ of the Formula (1).

Next, at a step S2 all the divided patterns B11 to B18 are classified in terms of linewidth W in a direction excluding a direction of a cutting surface, and at a step S3 a CD-DOSE curve which is a standard of a group of patterns having the linewidth W is determined (hereinafter, it is referred to as a standard CD-DOSE curve). The standard CD-DOSE curve is selected so that the dimensional change with respect to the change of the dose becomes minimum in a feasible range for all the patterns of the group of patterns. More specifically, in the group of patterns, a pattern whose dimensional change is the largest with respect to the change of the dose is selected as a representative pattern. This representative pattern is, for example, a pattern whose peripheral patterns have the largest area density, or a pattern whose irradiation area is the largest. Then, the shape of the representative pattern is modified so that the dimensional change becomes minimum with respect to the change of the dose, and the configuration of the resultant CD-DOSE curve corresponds to the standard CD-DOSE curve. Here, for the sake of convenience, an example of the change in the shape of the representative pattern is expressed as a lines-and-spaces (L/S) pattern having a linewidth W and a pitch P. The deposited energy distribution of the resist at the center of this L/S pattern is obtained by the surface integral of the Formula (1) with respect to the L/S pattern. When the width of the deposited energy distribution is equal to W at a threshold value $E_{th}$ of the deposited energy if the modified linewidth is W' and the corrected dose is Q, the relation expressed in the Formula (2) below is established.

$$\{\epsilon(W', W, \beta_f) + \alpha\eta\}Q = E_{th} \quad (2)$$

Wherein, $\epsilon(W', W, \beta_f)$ is a forward scattering element of the deposited energy distribution, and $\alpha$ is the area density after the linewidth modification. These are expressed in Formula (3) below.

$$\varepsilon(W', W, \beta_f) = \frac{1}{2}\left\{\text{erf}\left(\frac{W'-W}{2\beta_f}\right) - \text{erf}\left(-\frac{W'-W}{2\beta_f}\right)\right\} \quad (3)$$

$$\alpha = \frac{W'}{P}$$

The linewidth W' is a value in which the dimensional change becomes minimum with respect to the change in the dose. In order to determining the linewidth W', the deviations $\Delta W_1$ and $\Delta W_2$ from the target linewidth W when the corrected dose Q is multiplied by $\gamma_1$ and $\gamma_2$ times ($\gamma_1 < 1 < \gamma_2$) are obtained from Formula (4) below and the above Formula (2), and the linewidth W' is determined so that the sum of the squared $\Delta W_1$ and $\Delta W_2$ becomes minimum.

$$\{\epsilon(W', W+\Delta W_1, \beta_1) + \alpha\eta\}\gamma_1 Q = E_{th}$$

$$\{\epsilon(W', W+\Delta W_2, \beta_f) + \alpha\eta\}\gamma_2 Q = E_{th} \quad (4)$$

When the above Formula (2) is substituted for the Formula (4), Formula (5) which does not depend on the corrected dose can be obtained.

$$\{\epsilon(W', W+\Delta W_1, \beta_f) + \alpha\eta\}\gamma_1 = \epsilon(W', W, \beta_f) + \alpha\eta$$

$$\{\epsilon(W', W+\Delta W_2, \beta_f) + \alpha\eta\}\gamma_2 = \epsilon(W', W, \beta_f) + \alpha\eta \quad (5)$$

In addition, when the shape of the representative pattern is modified, it is desired that the dimensional change with respect to the change of the dose including one or more known process fluctuations becomes minimum. For example, a case where fluctuation of the beam blur is considered will be explained. Since the beam blur is included in $\beta_f$ in the above Formula (1), the range in which $\beta_f$ moves due to the fluctuation of the beam blur is expressed as $\beta_{f1} \leq \beta_f \leq \beta_{f2}$. Assuming that $\gamma_o$ is 1 and a standard of $\beta_f$ is $\beta_{fo}$, the deviation delta $\Delta W_{i,j}$ from the target linewidth W at a combination of $\gamma$ and $\beta_f (\gamma_i, \beta_{fj})$ (i=0, 1, 2; j=0, 1, 2) is obtained from the following Formula (6) which is a substitute for the above Formula (5).

$$\{\epsilon(W', W+\Delta W_{i,j}, \beta_{fj}) + \alpha\eta\}\gamma_i = \epsilon(W', W, \beta_f) + \alpha\eta \quad (6)$$

Moreover, a weighting coefficient $c_{i,j}$ ($0 \leq c_{i,j} \leq 1$, $c_{o,o} = 0$) indicating priority is assigned for each combination of $\gamma$ and $\beta_f$, and the linewidth W' where the value $X^2$ of the following Formula (7) becomes minimum is obtained.

$$\chi^2 = \sum_{i,j} c_{i,j} \Delta W_{i,j}^2 \quad (7)$$

In this way, the standard CD-DOSE curve can be expressed as a combination of ($\gamma$, W+$\Delta$W) that satisfies the following Formula (8).

$$\{\epsilon(W', W+\Delta W, \beta_f) + \alpha\eta\}\gamma = \epsilon(W', W, \beta_f) + \alpha\eta \quad (8)$$

Next, in steps S4 to S7, the shape of the pattern is changed so that a CD-DOSE curve where the deviation from the standard CD-DOSE curve is minimum is obtained for each pattern of the group of patterns classified in terms of linewidth. Moreover, in steps S8 to S10, dose is corrected for each pattern to obtain a target linewidth considering the peripheral patterns, and exposure data for an electron beam 13 is stored in the memory.

In a step S4, the corrected linewidth W' where the difference between the CD-DOSE curve of each pattern and the standard CD-DOSE curve becomes minimum is calculated. In a step S5, it is judged whether or not the corrected linewidth W' is larger than the target linewidth W, and when the result is YES, the flow goes to a step S6, and when the result is NO, the flow goes to a step S7. In the step S6, the linewidth becomes thicker by W-W'. On the other hand, in the step S7 the linewidth becomes thinner by W-W'. The procedures in the steps S4 to S7 are executed a number of times corresponding to the number of patterns by loop handling. Moreover, the procedures in the steps S3 to S7 are executed a number of times corresponding to the number of kinds of linewidth by loop handling.

In a step S8, the corrected dose Q of each pattern is initialized. In a step S9, the corrected dose Q is corrected to Q' in order to obtain the target dimension (the target linewidth W) for the purpose of obtaining the backscattering intensity from the peripheral patterns for each pattern. In a step S10, it is judged whether |Q'-Q|<ε, and when the result is NO, the flow returns to the step S9, and when the result is YES, the corrected dose Q is corrected to Q', and the exposure data for an electron beam 13 is stored in the memory. Since the backscattering intensity changes when the corrected dose Q is corrected to Q', the procedures of the steps S9 and S10 are repeated for all the patterns until the difference between the former corrected dose Q and the current corrected dose Q' becomes sufficiently small, that is, below the threshold value ε. Additionally, the calculation of the backscattering intensity can be executed by using a method proposed, for example, in Japanese Laid-Open Patent Publication No. 2001-52999 or Japanese Laid-Open Patent Publication No. 2005-101501, and thus the explanation thereof is omitted.

Figure 7:
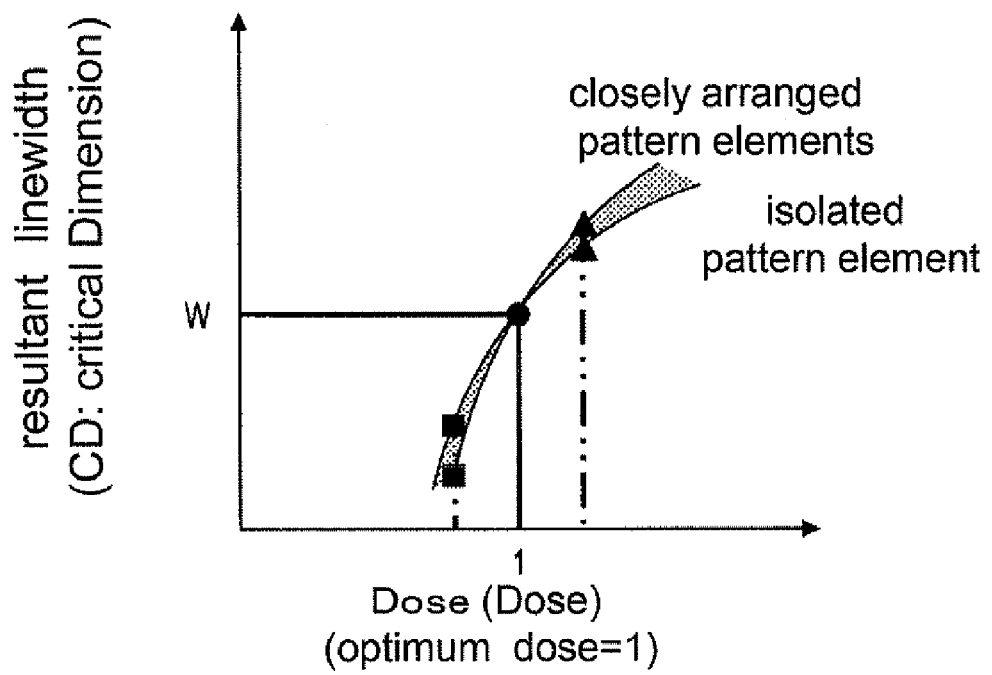
FIG. 7 is a drawing showing a CD-DOSE curve according to the embodiment of the present invention.
Figure 8:
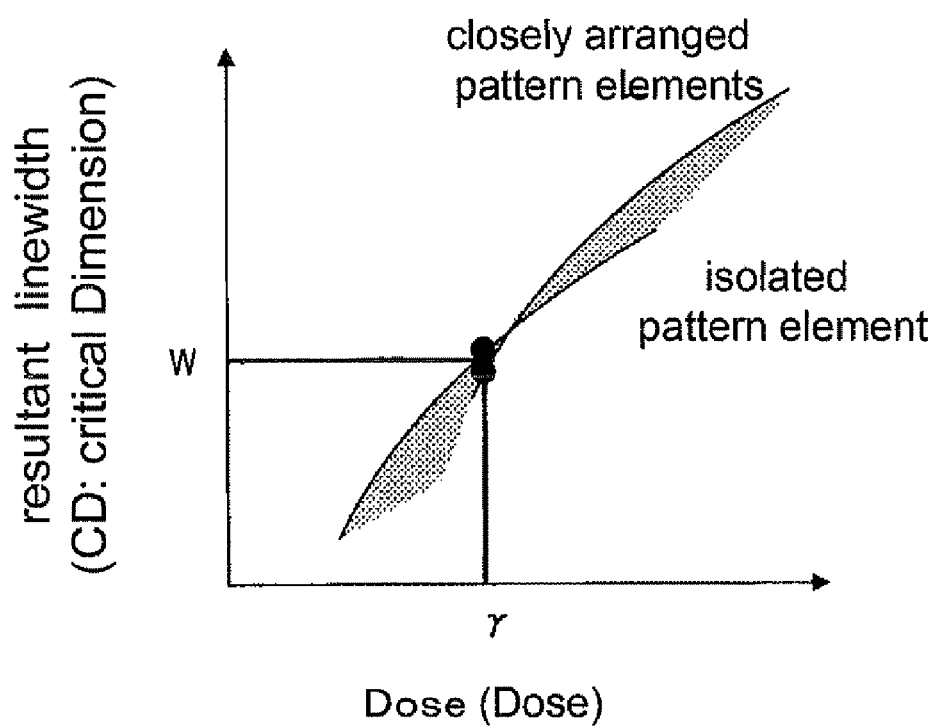
FIG. 8 is a drawing showing the change of the CD-DOSE curve with respect to process fluctuation according to the embodiment of the present invention.

FIGS. 6A to 6D are explanatory drawings of the deposited energy distribution in the embodiment. Among the figures, FIG. 6A shows an exposure pattern including an isolated pattern element and closely arranged pattern elements, FIG. 6B shows deposited energy distribution per unit of dose, FIG. 6C shows deposited energy distribution after dose correction, and FIG. 6D shows deposited energy distributions before and after dose correction. In FIG. 6B, W indicates the target linewidth. Moreover, in FIGS. 6B, 6C and 6D, the transverse axes indicate a position of a pattern per arbitrary unit. Moreover, in FIG. 6D, the dashed lines and phantom lines respectively indicate deposited energy distributions before and after the dose correction. FIG. 7 is a CD-DOSE curve in the embodiment in which the dose is standardized by the corrected dose for each pattern, and FIG. 8 shows the change of the CD-DOSE curve with respect to process fluctuation in the embodiment. In FIGS. 7 and 8, the vertical axes show the resultant linewidth (CD), and the transverse axes show the dose (DOSE). Moreover, a circular point shows the resultant linewidth with corrected dose, and rectangular points and triangular points respectively indicate the resultant linewidths before and after dose correction.

Here, a case where the deviation between two CD-DOSE curves becomes minimum in the procedure in the step 34 is determined as a case where the sum of the squared values of the difference between the resultant linewidths becomes minimum with respect to the dose selected nearby the corrected dose Q (in FIG. 7, the position where the dose is equal to 1). In other words, with respect to the kth pattern of a group of patterns, the deviations $\Delta W_{k,1}$ and $\Delta W_{k,2}$ from the target linewidth W at a position of $\gamma_1, \gamma_2$ are obtained by the following Formula (9) in a similar manner to the calculation of the above Formula (5), and the minimum value of $(\gamma W_{k,1} - \Delta W_1)^2 + (\Delta W_{k,2} - \Delta W_2)^2$ is obtained as $W_k'$.

$$\{\epsilon(W_k', W + \Delta W_{k,1}, \beta_f) + \alpha_k \eta\}\gamma_1 = \epsilon(W_k', W, \beta_f) + \alpha_k \eta$$

$$\{\epsilon(W_k', W + \Delta W_{k,2}, \beta_f) + \alpha_k \eta\}\gamma_2 = \epsilon(W_k', W, \beta_f) + \alpha_k \eta \quad (9)$$

Wherein, $\alpha_k \eta$ is a backscattering element of the deposited energy distribution in the kth pattern.

When the shape of each pattern is modified, it is desirable to correct the shape so that the sum of the squared values of the deviation from the standard CD-DOSE curve with respect to one or more known process fluctuations becomes minimum.

Next, for each pattern whose shape is corrected, the dose as shown in FIG. 6B is corrected to the corrected dose $Q_k'$ as shown in FIG. 6C so that the target linewidth W is obtained at a threshold value $E_{th}$ of the deposited energy under a condition that there is no process fluctuation using the following Formula (10).

$$\{\epsilon(W_k', W, \beta_f) + \alpha_k \eta\} Q_k' = E_{th} \quad (10)$$

$$Q_k' = \frac{E_{th}}{\epsilon(W_k', W, \beta_f) + \alpha_k \eta}$$

Lastly, on the basis of a pattern having the shape corrected above and the corrected dose $Q_k'$, the exposure data for an electron beam 13 is prepared.

Accordingly, in the embodiment, fluctuation of the resultant linewidth between the patterns is reduced per dose nearby the dose correction with respect to the known process fluctuation in a group of patterns having the same target linewidth. In other words, as understood from FIGS. 6A to 6D and 7, exposure data is prepared so that the CD-DOSE curves are aligned with each other, and as understood from FIG. 8, exposure is executed by adjusting the dose so that the linewidth deviation is reduced with respect to unknown process fluctuation. The reason the patterns are classified in terms of the target linewidth is because there are differences in the acceptable amount of linewidth fluctuation and differences in the required dimensional accuracy and the like. By allowing the CD-DOSE curves to be aligned with each other, the CD-DOSE curves change in a similar manner with respect to process fluctuation, which reduces linewidth fluctuation between the patterns in a wide range of dose. Moreover, as shown in FIG. 8, a uniform adjustment of the dose reduces the deviation from the target linewidth compared to that of the existing case shown in FIG. 3.

According to the embodiment, since the linewidths of the patterns can be aligned with each other per dose nearby the dose correction, linewidth fluctuation between the patterns can be reduced with respect to process fluctuation. Moreover, a uniform adjustment of the dose reduces the deviation from the target linewidth.

Although the shape change is executed for patterns having any linewidth in the above embodiment, the process of the shape change may be omitted for patterns having a linewidth whose fluctuation is not necessarily reduced strictly.

[Exposure Steps]

FIG. 9 is a flowchart for explaining exposure steps. The procedures of steps S21 and S22 shown in FIG. 9 can be executed using an electron beam exposure apparatus (not shown) having a known configuration. In the exposure steps shown in FIG. 9, a pattern is delineated on a wafer 21 which is an exposure object by the electron beam exposure apparatus on the basis of the electron beam exposure data 13 prepared in the exposure data preparation steps shown in FIG. 4. Thereafter, the exposed wafer 21 is subjected to a known membrane removal process and a known membrane formation process, and various kinds of semiconductor devices can be fabricated.

In FIG. 9, in the step S21 an optimum dose having minimum deviation from the target linewidth is obtained, and a rate 65 of the corrected dose with respect to the optimum dose is determined by provisional exposure. In the step S22, a pattern is delineated on the wafer 21 on the basis of the determined rate γ and the electron beam exposure data 13. This allows actual production data of the semiconductor device etc. to be etched on the wafer 21.

In the provisional exposure in the step S21, evaluation data is used. This evaluation data is previously prepared so as to cover the combination of linewidth, intervals and area density permitted in a design rule. From the evaluation data, exposure data is prepared in a similar manner to the above exposure data preparation steps, and several values of the dose mainly under a condition that there is no process fluctuation are presented in order to execute exposure, more specifically, the provisional exposure. The resultant linewidth of an evaluation pattern for each dose value is measured by a Scanning Electron Microscope (SEM) to obtain the optimum dose where fluctuation from the target linewidth is minimum.

In the above embodiment, the present invention is applied to electron beam exposure technology. However, the present invention is applicable to any other technology in a similar manner as long as it is a charged particle beam exposure technology where the shape and the corrected dose can be modified for each pattern such as an ion beam exposure technology.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification related to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method for preparing exposure data for charged particle beam exposure in which an exposure object is exposed by a charged particle beam, the method comprising:
    dividing a first pattern which is included in the exposure object into second patterns;
    classifying the second patterns in terms of linewidth;

setting a standard characteristic indicating a relationship between a standard dose of the charged particle beam and a resultant linewidth of a standard resist pattern, the standard resist pattern having the resultant linewidth being in accordance with patterns which are obtained by exposing the classified second patterns in terms of linewidth to the charged particle beam with the standard dose;

determining a characteristic indicating a relationship between a dose of the charged particle beam and a linewidth of a resist pattern, the resist pattern having the linewidth being obtained by exposing one of the classified second patterns in terms of linewidth to the charged particle beam with the dose;

correcting a linewidth of the one of the classified second patterns in terms of linewidth so that the characteristic follows the standard characteristic; and preparing exposure data for a final dose of the charged particle beam to expose the classified second patterns to get a resist pattern having a target linewidth in accordance with the standard characteristic.

2. The method for preparing exposure data according to claim 1, wherein the first pattern is divided, in advance, into second patterns whose size is below a maximum division size which is large enough to consider a backscattering element of deposited energy on a resist as substantially constant, the characteristic is a CD-DOSE curve and the standard characteristic is a standard CD-DOSE curve, and the preparing exposure data for the final dose of the charged particle beam to expose the classified second patterns to get the resist pattern having the target linewidth in accordance with the standard characteristic comprises correcting the final dose of each second classified pattern so that the target linewidth is obtained at a threshold value of the deposited energy.

3. The method for preparing exposure data according to claim 2, wherein the setting the standard characteristic showing the relationship between the standard dose of the charged particle beam and the resultant linewidth of the standard resist pattern comprises setting an amount of a resultant linewidth change with respect to a change of the standard dose of the standard CD-DOSE curve on a basis of arrangement of the second patterns.

4. The method for preparing exposure data according to claim 3, further comprising:

determining the amount of the resultant linewidth change with respect to the change of the standard dose of the standard CD-DOSE curve on the basis of a representative classified second pattern whose linewidth change with respect to the change of the dose is the largest among the classified second patterns.

5. The method for preparing exposure data according to claim 4, wherein the standard CD-DOSE curve is a CD-DOSE curve in which a shape of the representative classified second pattern is corrected so that the linewidth change with respect to the change of the standard dose becomes minimum.

6. The method for preparing exposure data according to claim, further comprising:

correcting the shape of the representative classified second pattern so that the linewidth change with respect to the change of the dose becomes minimum with respect to one or more known process fluctuations.

7. The method for preparing exposure data according to claim 1 wherein the characteristic is a CD-DOSE curve and the standard characteristic is a standard CD-DOSE curve, and the correcting the linewidth of the one of the classified second patterns in terms of linewidth so that the characteristic showing the relationship between the dose of the charged particle beam and the linewidth of the resist pattern follows the standard characteristic comprises correcting the linewidth of each of the classified second patterns in terms of linewidth so as to obtain the CD-DOSE curve where the deviation from the standard CD-DOSE curve is minimum for each classified second pattern.

8. The method for preparing exposure data according to claim 7 wherein the correcting the linewidth of the one of the classified second patterns in terms of linewidth so that the characteristic showing the relationship between the dose of the charged particle beam and the linewidth of the resist pattern follows the standard characteristic comprises correcting the linewidth of each of the classified second patterns in terms of linewidth so as to obtain the CD-DOSE curve where the deviation from the standard CD-DOSE curve is minimum for each classified second pattern with respect to one or more known process fluctuations.

9. The method for preparing exposure data according to claim 7, wherein a range of the standard dose to calculate the deviation from the standard CD-DOSE curve includes a dose value capable of obtaining the target linewidth and dose values adjacent to the value.

10. The method for preparing exposure data according to claim 7, further comprising:

preparing exposure data for the final dose of the charged particle beam to expose the classified second patterns to get the resist pattern having the target linewidth in accordance with the standard characteristic under a condition that there is no process fluctuation.

11. A method for exposing, using a charged particle beam exposure technology, an exposure object by a charged particle beam having the final dose in accordance with claim 1 comprising:

exposing the exposure object with the charged particle beam having a dose which is obtained by uniformly adjusting the final dose for all the classified second patterns so that a fluctuation becomes minimum.

12. The method for exposing an exposure object according to claim 11, wherein the first pattern is divided, in advance, into second patterns whose size is below a maximum division size which is large enough to consider a backscattering element of deposited energy on a resist as substantially constant, the characteristic is a CD-DOSE curve and the standard characteristic is a standard CD-DOSE curve, and wherein the preparing exposure data for the final dose of the charged particle beam to expose the classified second patterns to get the resist pattern having the target linewidth in accordance with the standard characteristic comprises correcting the final dose of each second classified pattern so that the target linewidth is obtained at a threshold value of the deposited energy.

13. The method for exposing an exposure object according to claim 11, wherein the exposing the exposure object with the charged particle beam having the dose which is obtained by uniformly adjusting the final dose for all the classified second patterns so that the fluctuation becomes minimum comprises:

obtaining an optimum dose so that a fluctuation of an evaluation target linewidth of the resist pattern becomes minimum;

determining a rate of the corrected dose with respect to an optimum dose by provisional exposure that is performed using provisional exposure data; and exposing the exposure object to the charged particle beam with a dose on the basis of the rate and exposure data for the charged particle beam.

14. The method for exposing an exposure object according to claim 13, wherein, in the provisional exposure, the provisional exposure data is prepared from evaluation data previously prepared so as to cover a combination of linewidth, intervals and area density permitted in a design rule, several values of the dose mainly under a condition that there is no process fluctuation are presented in order to execute exposure, and the resultant linewidth of an evaluation pattern for each dose value is measured to obtain the optimum dose where fluctuation from the target linewidth becomes minimum.

15. The method for exposing an exposure object according to claim 12, wherein:
the setting a standard characteristic showing a relationship between a standard dose of the charged particle beam and a resultant linewidth of a standard resist pattern comprises setting the amount of the resultant linewidth change with respect to the change of the standard dose of the standard CD-DOSE curve on the basis of arrangement of the second patterns.

16. The method for exposing an exposure object according to claim 15, further comprising:
determining the amount of the resultant linewidth change with respect to the change of the standard dose of the standard CD-DOSE curve on the basis of a representative classified second pattern whose linewidth change with respect to the change of the dose is the largest among the classified second patterns.

17. The method for exposing an exposure object according to claim 16, wherein the standard CD-DOSE curve is a CD-DOSE curve in which a shape of the representative classified second pattern is corrected so that the linewidth change with respect to the change of the standard dose becomes minimum.

18. The method for exposing an exposure object according to claim 17, further comprising:
correcting the shape of the representative classified second pattern so that the linewidth change with respect to the change of the dose becomes minimum with respect to one or more known process fluctuations.

19. The method for exposing an exposure object according to claim 11, wherein the characteristic is a CD-DOSE curve and the standard characteristic is a standard CD-DOSE curve, and the correcting the linewidth of the one of the classified second patterns in terms of linewidth so that the characteristic showing the relationship between the dose of the charged particle beam and the linewidth of the resist pattern follows the standard characteristic comprises correcting the linewidth of each of the classified second patterns in terms of linewidth so as to obtain a CD-DOSE curve where the deviation from the standard CD-DOSE curve is minimum for each classified second pattern.

20. The method for exposing an exposure object according to claim 19, wherein the correcting a linewidth of the one of the classified second patterns in terms of linewidth so that the characteristic showing the relationship between the dose of the charged particle beam and the linewidth of the resist pattern follows the standard characteristic comprises correcting the linewidth of each of the classified second patterns in terms of linewidth so as to obtain the CD-DOSE curve where the deviation from the standard CD-DOSE curve is minimum for each classified second pattern with respect to one or more known process fluctuations.

* * * * *

UNITED STATES PATENT AND TRADEMARK OFFICE
CERTIFICATE OF CORRECTION

| | |
|---|---|
| PATENT NO. | : 7,977,018 B2 |
| APPLICATION NO. | : 12/332456 |
| DATED | : July 12, 2011 |
| INVENTOR(S) | : Kozo Ogino et al. |

Page 1 of 1

It is certified that error appears in the above-identified patent and that said Letters Patent is hereby corrected as shown below:

Column 9, Line 58, In Claim 6, delete "claim," and insert --claim 5,--, therefor.

Column 10, Line 36 (Approx.), In Claim 11, delete "1" and insert --1,--, therefor.

Signed and Sealed this

Thirteenth Day of September, 2011

David J. Kappos
*Director of the United States Patent and Trademark Office*